(12) United States Patent
Karino

(10) Patent No.: US 12,451,425 B2
(45) Date of Patent: Oct. 21, 2025

(54) SEMICONDUCTOR ELEMENT WITH RESISTIVE LAYERS HAVING DIFFERENT RESISTANCE VALUES

(71) Applicant: FUJI ELECTRIC CO., LTD., Kawasaki (JP)

(72) Inventor: Taichi Karino, Nagano (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 619 days.

(21) Appl. No.: 17/874,901

(22) Filed: Jul. 27, 2022

(65) Prior Publication Data

US 2023/0082803 A1    Mar. 16, 2023

(30) Foreign Application Priority Data

Sep. 16, 2021  (JP) ................. 2021-151005

(51) Int. Cl.
| | |
|---|---|
| *H01L 23/522* | (2006.01) |
| *H01C 1/142* | (2006.01) |
| *H01L 23/00* | (2006.01) |
| *H10D 1/47* | (2025.01) |

(52) U.S. Cl.
CPC ......... *H01L 23/5228* (2013.01); *H01C 1/142* (2013.01); *H01L 24/05* (2013.01); *H10D 1/474* (2025.01); *H01L 2224/04042* (2013.01); *H01L 2224/05553* (2013.01)

(58) Field of Classification Search
CPC .. H01C 1/14–148; H01C 1/142; H01C 1/144; H01C 7/006; H01C 17/006; H01L 23/5228; H01L 24/05; H01L 2224/04–04105; H01L 2224/04042; H10D 1/40–476; H10D 1/47; H10D 1/472; H10D 1/474

See application file for complete search history.

(56) References Cited

U.S. PATENT DOCUMENTS

| | | | |
|---|---|---|---|
| 6,851,100 B1 | 2/2005 | You et al. | |
| 10,727,180 B2 | 7/2020 | Karino et al. | |
| 2017/0243831 A1* | 8/2017 | Butler | H01L 23/544 |
| 2019/0181089 A1* | 6/2019 | Karino | H01L 23/5228 |
| 2019/0181216 A1* | 6/2019 | Saito | H01L 23/5228 |

(Continued)

FOREIGN PATENT DOCUMENTS

| | | |
|---|---|---|
| JP | 1051308 A | 2/1998 |
| JP | 2003282603 A | 10/2003 |

(Continued)

*Primary Examiner* — Eric A. Ward

(57) ABSTRACT

A semiconductor element includes: a first resistive layer; a second resistive layer provided separately from the first resistive layer and having a resistance value different from that of the first resistive layer; a first external connection electrode electrically connected to one end of the first resistive layer; a second external connection electrode provided separately from the first external connection electrode and electrically connected to one end of the second resistive layer; and a passivation film provided to cover the first and second external connection electrodes and having a first opening and a second opening to which top surfaces of the first and second external connection electrodes are partly exposed, wherein the first opening and the second opening having planar patterns with shapes different from each other.

13 Claims, 14 Drawing Sheets

(56) References Cited

U.S. PATENT DOCUMENTS

2020/0051874 A1\* 2/2020 Sasaki .................... G01R 31/66
2020/0191857 A1\* 6/2020 Karino .................... H10D 1/47
2021/0305157 A1\* 9/2021 Tanaka ................ H01L 23/5256

FOREIGN PATENT DOCUMENTS

JP        2019106485 A    6/2019
JP         202098822 A    6/2020

\* cited by examiner

SEMICONDUCTOR ELEMENT WITH RESISTIVE LAYERS HAVING DIFFERENT RESISTANCE VALUES

CROSS-REFERENCE TO RELATED APPLICATION

This application claims benefit of priority under 35 USC 119 based on Japanese Patent Application No. 2021-151005 filed on Sep. 16, 2021, the entire contents of which are incorporated by reference herein.

BACKGROUND OF THE INVENTION

1. Field of the Invention

The present invention relates to a semiconductor element used as a gate resistive element of a switching element.

2. Description of the Related Art

A semiconductor element (a resistive element) used for a semiconductor integrated circuit (IC), for example, is known that is provided with a resistive layer having a polycrystalline silicon (polysilicon) thin film. Such a semiconductor element has a structure in which two electrodes are connected to both ends of the resistive layer on the top surface side, and bonding wires are bonded to these two electrodes. This structure inevitably increases the chip size and requires the two bonding wires connected to the two electrodes.

JP 2019-106485 A and JP 2020-98822 A each disclose a vertical-type semiconductor element through which current flows in the vertical direction, having a structure in which one end of a resistive layer on the top surface side is connected to an electrode, and another end of the resistive layer is in ohmic contact with a semiconductor substrate via a relay wire. The use of the vertical semiconductor element can reduce the size of the chip more than the case of using a horizontal semiconductor element, and can also decrease the number of bonding wires connected to the electrodes.

The semiconductor element disclosed in each of JP 2019-106485 A and JP 2020-98822 A is used as a gate resistive element of an insulated gate bipolar transistor (IGBT) for a semiconductor module, for example. The semiconductor element disclosed in each of JP 2019-106485 A and JP 2020-98822 A, when using two IGBT chips, can have a structure provided with two resistive layers corresponding to two IGBT chips on one chip. The structure using the two resistive layers having the same resistance value and arranged into a pattern with line symmetry can allow a 180-degree rotation of the chip upon the assembly.

JP H10-51308 A discloses a semiconductor integrated circuit device that converts a digital signal to an analog signal or converts an analog signal to a digital signal by a resistance dividing method. The semiconductor integrated circuit device includes a resistance dividing circuit including the (2n−2) number of first resistive means connected in series and having the same resistance value, first accuracy trimming means connected to one end of the respective first resistive means connected in series so as to improve a trimming accuracy, second accuracy trimming means connected to another end of the respective first resistive means connected in series so as to improve the trimming accuracy, and a selection switch connected in parallel to a connection unit of each of the first resistive means and the first and second accuracy trimming means.

JP 2003-282603 A discloses an integrated management system that automatically performs a process for referring to an assembly standard and a bonding standard for manufacturing an IC package element and editing. The system includes a drawing management system (DMS) for creating the assembly standard having a bonding diagram, a package outline view, a package pin configuration, and pin coordinate data based on chip layout data, lead frame blank view, and package outline view, and a bonding standard creation system (eSPEC) for creating the bonding standard using the assembly standard as a basic data.

The resistance value of the semiconductor element disclosed in each of JP 2019-106485 A and JP 2020-98822 A needs to be set to an appropriate value for each semiconductor module equipped with the semiconductor element. Although depending on the case, the resistance value of the semiconductor element disclosed in each of JP 2019-106485 A and JP 2020-98822 A is required to be specifically set in order to ensure sufficient performance of the IGBT chip, which inevitably increases the series number.

SUMMARY OF THE INVENTION

In view of the foregoing problems, the present invention provides a semiconductor element with a structure that can choose an appropriate resistance value without an increase in the series number.

An aspect of the present invention inheres in a semiconductor element including: a first resistive layer; a second resistive layer provided separately from the first resistive layer and having a resistance value different from that of the first resistive layer; a first external connection electrode electrically connected to one end of the first resistive layer; a second external connection electrode provided separately from the first external connection electrode and electrically connected to one end of the second resistive layer; and a passivation film provided to cover the first and second external connection electrodes and having a first opening and a second opening to which top surfaces of the first and second external connection electrodes are partly exposed, wherein the first opening and the second opening having planar patterns with shapes different from each other.

DETAILED DESCRIPTION

Figure 1:
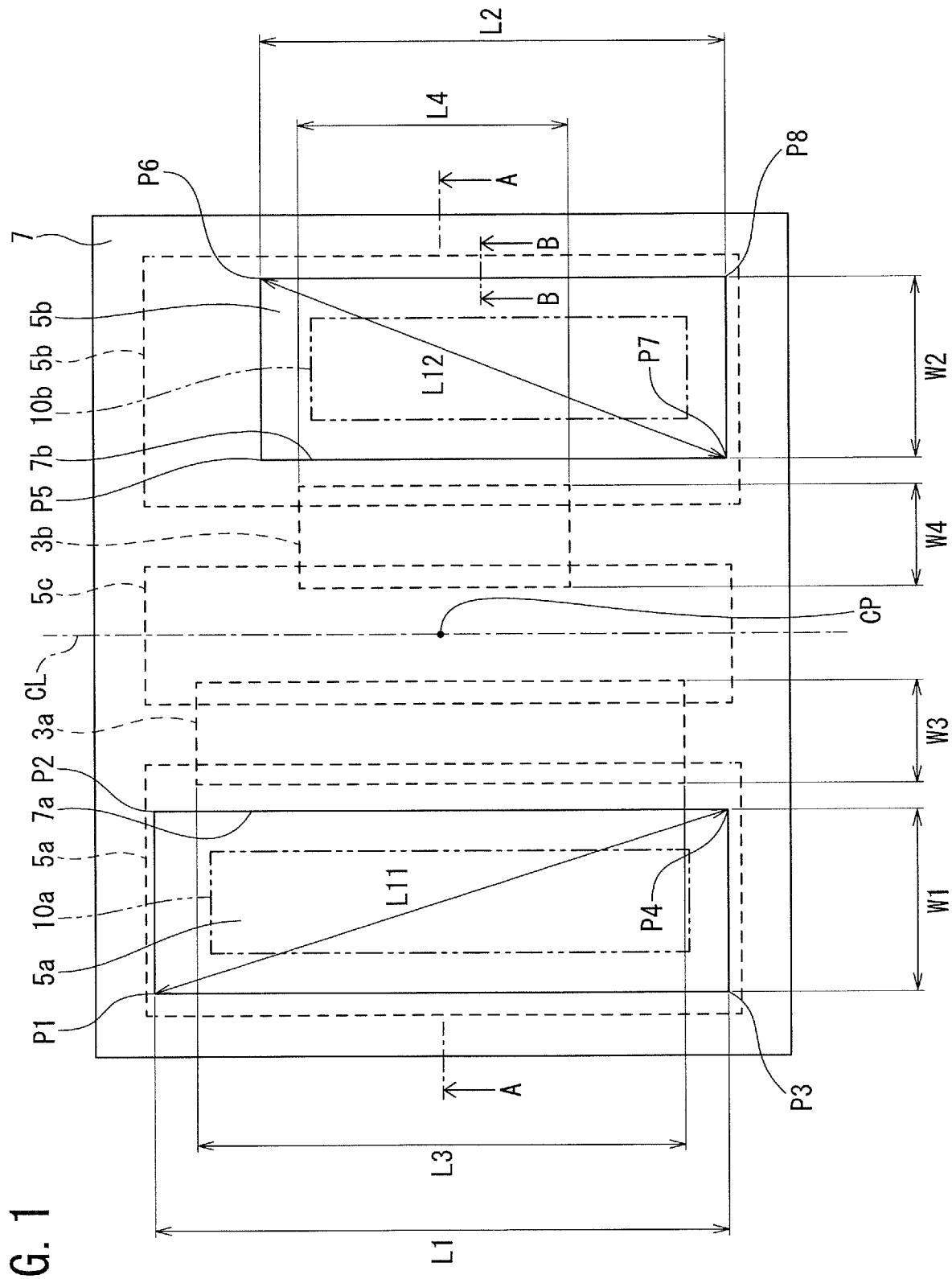
FIG. 1 is a plan view illustrating an example of a semiconductor element according to a first embodiment of the present invention.

With reference to the Drawings, embodiments of the present invention will be described below.

In the Drawings, the same or similar elements are indicated by the same or similar reference numerals. The Drawings are schematic, and it should be noted that the relationship between thickness and planer dimensions, the thickness proportion of each layer, and the like are different from real ones. Moreover, in some drawings, portions are illustrated with different dimensional relationships and proportions. The embodiments described below merely illustrate schematically devices and methods for specifying and giving shapes to the technical idea of the present invention, and the span of the technical idea is not limited to materials, shapes, structures, and relative positions of elements described herein.

Further, definitions of directions such as an up-and-down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction. Similarly, when the relationship between the front and back is rotated by 180°, the inverted term is defined.

First Embodiment

<Semiconductor Element>

A semiconductor element according to a first embodiment of the present invention is a resistive element (a resistive chip) with a rectangular planar pattern having a longitudinal direction in which a pair of a first external connection electrode 5a and a second external connection electrode 5b and a relay wire 5c are arranged (the right-left direction in FIG. 1), as illustrated in FIG. 1. The semiconductor element according to the first embodiment has a chip size of about 3.0 millimeters×2.5 millimeters, for example. The pair of the first external connection electrode 5a and the second external connection electrode 5b and the relay wire 5c are covered with a passivation film 7. FIG. 1 schematically indicates, by the broken lines, the pair of the first external connection electrode 5a and the second external connection electrode 5b and the relay wire 5c located under the passivation film 7.

The first external connection electrode 5a and the second external connection electrode 5b have substantially the same shape. The first external connection electrode 5a and the second external connection electrode 5b are arranged in parallel separately from each other. The first external connection electrode 5a and the second external connection electrode 5b have a rectangular planar pattern in which a longitudinal direction corresponds to the upper-lower direction in FIG. 1. The first external connection electrode 5a and the second external connection electrode 5b each have a length of about 2.1 millimeters, a width of about 1.0 millimeters, and a gap of about 0.5 millimeters, for example.

The relay wire 5c is interposed between the first external connection electrode 5a and the second external connection electrode 5b. The relay wire 5c also has a rectangular planar pattern in which the longitudinal direction corresponds to the upper-lower direction in FIG. 1. The relay wire 5c is located on the central line CL passing through the central point CP of the chip.

The first external connection electrode 5a, the second external connection electrode 5b, and the relay wire 5c are arranged to have a planar pattern with line symmetry about the central line CL passing through the central point CP of the chip so as to have two-fold rotational symmetry about the central point CP of the chip. The first external connection electrode 5a, the second external connection electrode 5b, and the relay wire 5c are not necessarily arranged to have the planar pattern having line symmetry about the central line CL passing through the central point CP of the chip. The planar pattern of the first external connection electrode 5a, the second external connection electrode 5b, and the relay wire 5c does not necessarily have the two-fold rotational symmetry about the central point CP of the chip.

The passivation film 7 is provided with a first opening 7a to which a part of the top surface of the first external connection electrode 5a is exposed and a second opening 7b to which a part of the top surface of the second external connection electrode 5b is exposed. The first opening 7a and the second opening 7b are arranged in parallel separately from each other. The first opening 7a and the second opening 7b have shapes and sizes different from each other.

The first opening 7a illustrated on the left side in FIG. 1 has a rectangular planar pattern having a length L1 in the upper-lower direction in FIG. 1 and a width W1 in the right-left direction in FIG. 1. The length L1 of the first opening 7a is about 2.0 millimeters, and the width W1 is about 0.9 millimeters, for example. The second opening 7b illustrated on the right side in FIG. 1 has a rectangular planar pattern having a length L2 in the upper-lower direction in FIG. 1 and a width W2 in the right-left direction in FIG. 1. FIG. 1 illustrates the case in which the length L1 of the first opening 7a is greater than the length L2 of the second opening 7b. The width W1 of the first opening 7a is substantially the same as the width W2 of the second opening 7b.

A diagonal length L11 of the first opening 7a, which is a distance between a corner P1 on the upper left side and a corner P4 on the lower right side of the first opening 7a, is greater than a diagonal length L12 of the second opening 7b, which is a distance between a corner P6 on the upper right side and a corner P7 on the lower left side of the second opening 7b. To distinguish between the first opening 7a and the second opening 7b, a difference between the diagonal length L11 of the first opening 7a and the diagonal length L12 of the second opening 7b is preferably set to 50 micrometers or greater.

The difference between the width W1 of the first opening 7a and the width W2 of the second opening 7b and the difference between the length L1 of the first opening 7a and the length L2 of the second opening 7b can vary when the first opening 7a and the second opening 7b have different shapes. For example, the width W1 of the first opening 7a may be either greater than or less than the width W2 of the second opening 7b. The length L1 of the first opening 7a may be either the same as or less than the length L2 of the second opening 7b.

The first opening 7a and the second opening 7b have the planar patterns not symmetrical about the central line CL passing through the central point CP of the chip, and are arranged into the shapes at the positions that are not symmetrical about the central point CP of the chip. The first opening 7a and the second opening 7b, which have the shapes and sizes different from each other, are not arranged into a pattern with line symmetry about the central line CL passing through the central point CP of the chip, or not arranged to have two-fold rotational symmetry (point symmetry) about the central point CP of the chip.

The part of each of the first external connection electrode 5a and the second external connection electrode 5b exposed to each of the first opening 7a and the second opening 7b serves as a pad region for packaging to which an external connection means such as a bonding wire can be connected. FIG. 1 schematically indicates, by the dashed and double-dotted lines, an effective connection region 10a and an effective connection region 10b on the inner side of the first opening 7a and the second opening 7b to which bonding wires can be effectively connected. The effective connection region 10a has a size of about 1.3 millimeters×0.7 millimeters or smaller, for example. The effective connection region 10b has a smaller area than the effective connection region 10a.

A first resistive layer 3a is arranged between the first external connection electrode 5a and the relay wire 5c under the first external connection electrode 5a and the relay wire 5c so as to partly overlap with the first external connection electrode 5a and the relay wire 5c. A second resistive layer 3b is arranged between the second external connection electrode 5b and the relay wire 5c under the second external connection electrode 5b and the relay wire 5c so as to partly overlap with the second external connection electrode 5b and the relay wire 5c. FIG. 1 schematically indicates the first resistive layer 3a and the second resistive layer 3b by the broken lines.

The first resistive layer 3a and the second resistive layer 3b have different resistance values. The first resistive layer 3a and the second resistive layer 3b have planar patterns with shapes and sizes different from each other. The first resistive layer 3a has a rectangular planar pattern having a length L3 in the upper-lower direction in FIG. 1 and a width W3 in the right-left direction in FIG. 1. The second resistive layer 3b has a rectangular planar pattern having a length L4 in the upper-lower direction in FIG. 1 and a width W4 in the right-left direction in FIG. 1. The length L3 of the first resistive layer 3a is greater than the length L4 of the second resistive layer 3b. The width W3 of the first resistive layer 3a is substantially the same as the width W4 of the second resistive layer 3b. The resistance value of the first resistive layer 3a is smaller than the resistance value of the second resistive layer 3b.

The first resistive layer 3a and the second resistive layer 3b only need to have different resistance values, and the difference between the length L3 of the first resistive layer 3a and the length L4 of the second resistive layer 3b and the difference between the width W3 of the first resistive layer 3a and the width W4 of the second resistive layer 3b can vary. For example, the length L3 of the first resistive layer 3a may be either the same as or less than the length L4 of the second resistive layer 3b. The width W3 of the first resistive layer 3a may be either greater than or less than the width W4 of the second resistive layer 3b.

Figure 2:
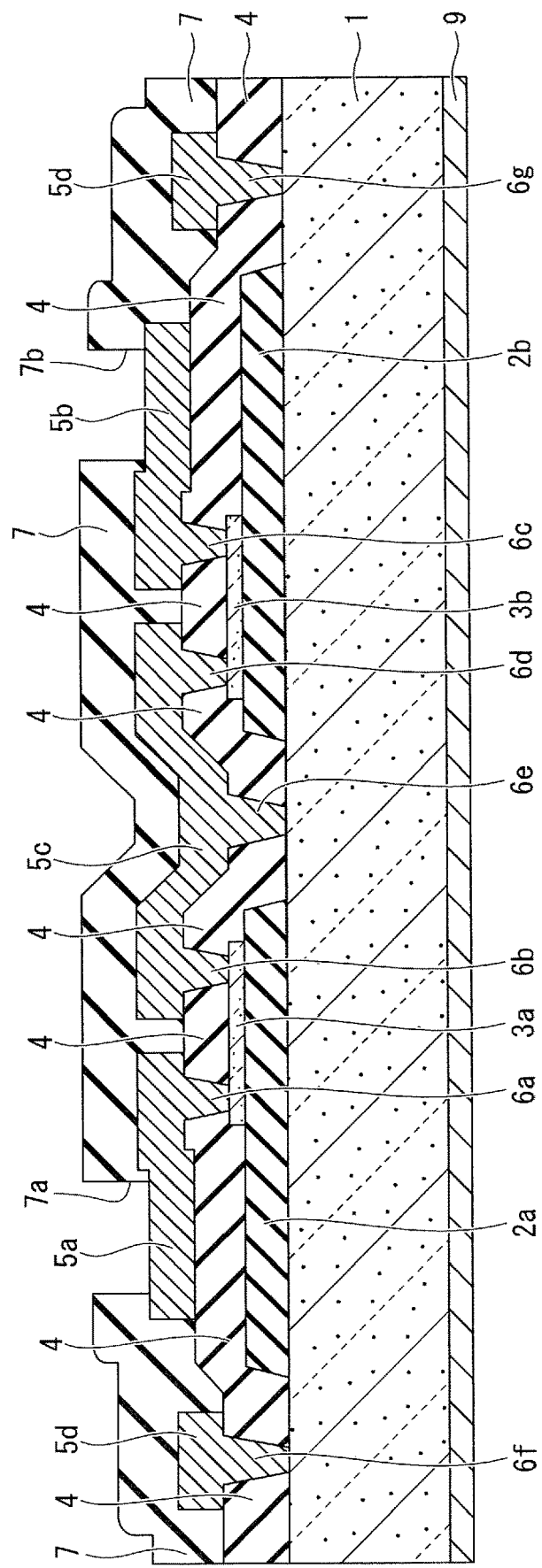
FIG. 2 is a cross-sectional view of the semiconductor element perpendicularly cross-sectioned along line A-A in FIG. 1.

As illustrated in FIG. 2, the semiconductor element according to the first embodiment includes a semiconductor substrate 1 of a first conductivity type ($n^-$-type), lower-layer insulating films 2a and 2b, and the first resistive layer 3a and the second resistive layer 3b. The lower-layer insulating films 2a and 2b are deposited on the semiconductor substrate 1. The first resistive layer 3a and the second resistive layer 3b are deposited on the lower-layer insulating films 2a and 2b.

The semiconductor element according to the first embodiment can be used as a gate resistive element of an insulated gate semiconductor element such as an insulated gate bipolar transistor (IGBT) or a metal-insulator-semiconductor (MIS) transistor. The semiconductor element according to the first embodiment, when used as a gate resistive element, has a structure in which the semiconductor substrate 1 has a thickness of about 250 micrometers to 450 micrometers, and has specific resistance typically set to a relatively low value, although these values depend on the specifications required. The semiconductor substrate 1 to be used can be a silicon (Si) substrate, for example.

While FIG. 2 illustrates the respective lower-layer insulating films indicated by the different reference numerals 2a and 2b, the lower-layer insulating films 2a and 2b may be a single film integrated on the back side of FIG. 2, for example. Although not illustrated in FIG. 2, a contact region of the first conductivity type ($n^+$-type) having lower specific resistance than the semiconductor substrate 1 is arranged between the respective lower-layer insulating films 2a and 2b at an upper part of the semiconductor substrate 1. When the semiconductor substrate 1 of a second conductivity type ($p^-$-type) is used, a semiconductor region of the second conductivity type ($p^+$-type) having lower specific resistance than the semiconductor substrate 1 may be provided as a contact region at an upper part of the semiconductor substrate 1.

The lower-layer insulating films 2a and 2b to be used each can be a field insulating film having a thickness of about 600 nanometers to 1000 nanometers, for example. The lower-layer insulating films 2a and 2b each may be a silicon oxide film (a Sift film), a silicon nitride film (a $Si_3N_4$ film), or a composite film of these films. The lower-layer insulating films 2a and 2b may also be an insulating film obtained by a chemical vapor deposition (CVD) method using gas of an organic silicon compound such as tetraethoxysilane (TEOS). The increase in thickness of the lower-layer insulating films 2a and 2b can reduce a parasitic capacitance.

The first resistive layer 3a and the second resistive layer 3b each have a thickness of about 400 nanometers to 600 nanometers, for example. The first resistive layer 3a and the second resistive layer 3b each have sheet resistance of about 100 Ω/sq to 200 Ω/sq, for example. The respective resistance values of the first resistive layer 3a and the second resistive layer 3b can be regulated such that the thicknesses of the first resistive layer 3a and the second resistive layer 3b, the lengths L3 and L4 of the first resistive layer 3a and the second resistive layer 3b (in the upper-lower direction in FIG. 1), the widths W3 and W4 of the first resistive layer 3a and the second resistive layer 3b (in the right-left direction in FIG. 1), and the material used for the first resistive layer 3a and the second resistive layer 3b are adjusted.

The material used for the first resistive layer 3a and the second resistive layer 3b can be polycrystalline silicon (doped polysilicon: DOPOS) doped with n-type impurity ions, for example. The n-type DOPOS can be obtained such that n-type impurity ions such as phosphorus (P) or boron (B) are implanted in polysilicon, or such that polysilicon is deposited by a CVD method while impurity ions are implanted from a vapor phase using doping gas. The use of the DOPOS for the first resistive layer 3a and the second resistive layer 3b can also regulate the respective resistance values of the first resistive layer 3a and the second resistive layer 3b by adjusting the amount of the impurity ions implanted in the polysilicon.

The first resistive layer 3a and the second resistive layer 3b preferably have a temperature coefficient of zero ppm/° C., or preferably have a negative temperature coefficient. Having such a temperature coefficient can avoid an increase in the resistance value during the operation at a high temperature. For example, the use of the semiconductor element according to the first embodiment as a gate resistor of the IGBT can reduce a loss of the IGBT when turned on. The temperature coefficient of the DOPOS can be regulated such that the dose upon the implantation of the impurity ions in the polysilicon is adjusted. The temperature coefficient of the DOPOS can be set to zero ppm/° C. or lower when the dose is set to about $7.0 \times 10^{15}$ cm$^{-2}$ or less, for example. The temperature coefficient of the first resistive layer 3a and the second resistive layer 3b is not necessarily set to zero ppm/° C. or lower, and the first resistive layer 3a and the second resistive layer 3b may have a positive temperature coefficient instead.

The first resistive layer 3a and the second resistive layer 3b are not limited to the DOPOS, and may be a nitride film of transition metal such as tantalum nitride (TaN$_x$), or a stacked metallic film having a high melting point including chromium (Cr), nickel (Ni), and manganese (Mn) stacked in this order. Alternatively, the first resistive layer 3a and the second resistive layer 3b may each be a thin film of silver-palladium (AgPd) or ruthenium oxide (RuO$_2$). Alternatively, the first resistive layer 3a and the second resistive layer 3b may be implemented by p-type diffusion layers or n-type diffusion layers deposited on the semiconductor surface, although this structure differs from that illustrated in FIG. 2.

An interlayer insulating film 4 is deposited to cover the lower-layer insulating films 2a and 2b, the first resistive layer 3a, and the second resistive layer 3b. The interlayer insulating film 4 has a thickness of about 1000 nanometers to 2000 nanometers, for example. Examples of the interlayer insulating film 4 include a silicon oxide film (a SiO$_2$ film) not containing impurity ions and typically referred to as a non-doped silicate glass (NSG) film, a phosphosilicate glass film (a PSG film), and a borosilicate glass film (a BSG film). Other examples include a single-layer film of a borophosphosilicate glass film (a BPSG film) or a silicon nitride (Si$_3$N$_4$) film, and a composite film of any of the above films combined together. For example, the interlayer insulating film 4 may be a composite film including a NSG film with a thickness of about 500 nanometers to 800 nanometers and a PSG film with a thickness of about 400 nanometers to 800 nanometers stacked together. The NSG film can decrease a variation in resistance. The PSG film can ensure the strength of the wire bonding.

The pair of the first external connection electrode 5a and the second external connection electrode 5b and the relay wire 5c are deposited on the interlayer insulating film 4. The first external connection electrode 5a is arranged over the lower-layer insulating film 2a so that the horizontal position of one end of the first external connection electrode 5a overlaps with one end of the first resistive layer 3a in the depth direction. The second external connection electrode 5b is arranged over the lower-layer insulating film 2b so that the horizontal position of one end of the second external connection electrode 5b overlaps with one end of the second resistive layer 3b in the depth direction. The relay wire 5c is deposited into substantially a T-shape in cross section as illustrated in FIG. 2 extending from a position over the lower-layer insulating film 2a to a position over the lower-layer insulating film 2b so as to be interposed between the first external connection electrode 5a and the second external connection electrode 5b.

The first external connection electrode 5a is connected to one end of the first resistive layer 3a via a contact region 6a. A resistive layer-connection terminal that is one end of the relay wire 5c is connected to the other end of the first resistive layer 3a via a contact region 6b. The second external connection electrode 5b is connected to one end of the second resistive layer 3b via a contact region 6c. A resistive layer-connection terminal that is another end of the relay wire 5c is connected to the other end of the second resistive layer 3b via a contact region 6d.

A substrate-connection terminal that is the middle end of the relay wire 5c is in ohmic contact with a contact region of n$^+$-type (not illustrated) provided at an upper part of the semiconductor substrate 1 at low contact resistance via a contact region 6e. A counter electrode 9 is deposited on the rear surface of the semiconductor substrate 1. This structure implements a vertical semiconductor element in which the first resistive layer 3a and the second resistive layer 3b are connected in series to the semiconductor substrate 1 via the relay wire 5c so that the region between the first external connection electrode 5a and the counter electrode 9 and the region between the second external connection electrode 5b and the counter electrode 9 each serve as a resistor.

The pair of the first external connection electrode 5a and the second external connection electrode 5b and the relay wire 5c each have a thickness of about three micrometers, for example. The pair of the first external connection electrode 5a and the second external connection electrode 5b and the relay wire 5c can be a stacked film including a titanium-titanium nitride (Ti—TiN) film with a thickness of about 100 nanometers to 130 nanometers serving as barrier metal, an aluminum-silicon (Al—Si) film with a thickness of about three micrometers, and a TiN—Ti film with a thickness of about 35 nanometers to 55 nanometers serving as a reflection preventing film. Instead of Al—Si, Al or an Al alloy such as Al—Cu—Si or Al—Cu may be used. The first external connection electrode 5a and the second external connection electrode 5b exposed to the first opening 7a and the second opening 7b of the passivation film 7 each serve as a pad region to which a bonding wire with a diameter of about 200 micrometers to 400 micrometers made of metal such as aluminum (Al) can be connected.

A guard ring layer 5d is deposited on the interlayer insulating film 4. The guard ring layer 5d is made from the same material as that for the pair of the first external connection electrode 5a and the second external connection electrode 5b and the relay wire 5c. The guard ring layer 5d is delineated into a ring shape along the outer peripheral part of the chip, for example. The guard ring layer 5d is in ohmic contact with the semiconductor substrate 1 via contact regions 6f and 6g.

Figure 3:
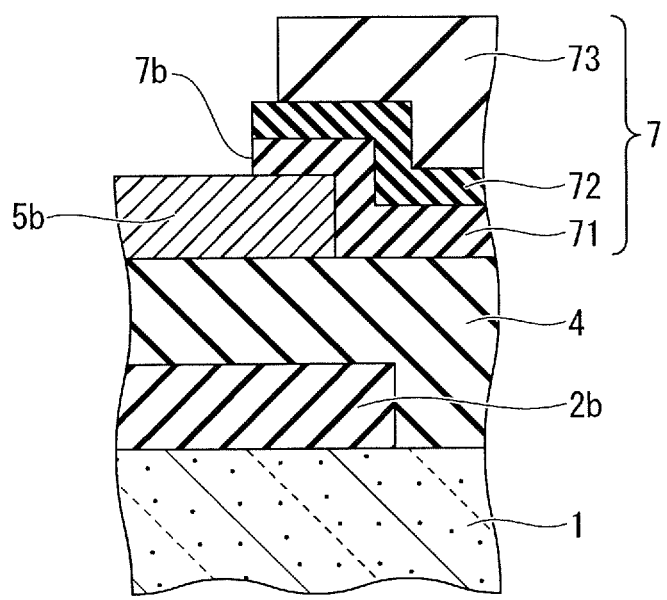
FIG. 3 is a cross-sectional view of the semiconductor element perpendicularly cross-sectioned along line B-B in FIG. 1.

The passivation film 7 is deposited on the pair of the first external connection electrode 5a and the second external connection electrode 5b and the relay wire 5c. The passivation film 7 is provided with the first opening 7a and the second opening 7b. The passivation film 7 may have a three-layer structure including a first passivation film 71, a second passivation film 72, and a third passivation film 73, as illustrated in FIG. 3, for example. The first passivation film 71 may be an oxide film such as a TEOS film. The second passivation film 72 may be a $Si_3N_4$ film. The third passivation film 73 may be a polyimide film.

For example, the first passivation film 71 of the TEOS film and the second passivation film 72 of the $Si_3N_4$ film are sequentially deposited by a CVD method, and the third passivation film 73 of the polyimide film is further applied on these films, so as to form the passivation film 71 with the three-layer structure. The third passivation film 73 is partly selectively delineated by photolithography and etching so as to provide the opening to which the top surface of the second passivation film 72 is exposed. The first passivation film 71 and the second passivation film 72 are then sequentially partly selectively delineated by photolithography and etching so as to provide the first opening 7a and the second opening 7b to which the top surfaces of the first external connection electrode 5a and the second external connection electrode 5b are partly exposed. The third passivation film 73 is thus retracted at the end of the second opening 7b, as illustrated in FIG. 3, so that the first passivation film 71 and the second passivation film 72 protrude. The end of the first opening 7a illustrated in FIG. 1 and FIG. 2 also has the same structure as the end of the second opening 7b illustrated in FIG. 3.

As illustrated in FIG. 2, the counter electrode 9 is deposited on the bottom surface of the semiconductor substrate 1. The counter electrode 9 may be a single film made from gold (Au), or a metallic film including titanium (Ti), nickel (Ni), and gold (Au) stacked in this order, for example. The outermost layer of the counter electrode 9 may be made from material which can be soldered. The counter electrode 9 is fixed to a metal plate and the like by soldering, for example.

The semiconductor element according to the first embodiment is based on the structure in which the resistive layer-connection terminals at the both ends of the T-shaped relay wire 5c are connected to the first resistive layer 3a and the second resistive layer 3b, as illustrated in FIG. 2. The substrate-connection terminal at the middle end of the T-shaped relay wire 5c is in ohmic contact with the $n^+$-type contact region (not illustrated) provided in the semiconductor substrate 1 at low contact resistance so as to implement the vertical semiconductor element. A single external connection region (a pad region) for packaging implemented by the first external connection electrode 5a connected to the first resistive layer 3a is allotted for the first resistive layer 3a. Similarly, a single external connection region (a pad region) for packaging implemented by the second external connection electrode 5b connected to the second resistive layer 3b is allotted for the second resistive layer 3b.

The semiconductor element according to the first embodiment thus only needs a single bonding wire for each of the first resistive layer 3a and the second resistive layer 3b, so as to decrease the total number of the bonding wires, as compared with a horizontal semiconductor element. The semiconductor element according to the first embodiment further contributes to a decrease in area occupied by the external connection regions (the pad regions) for packaging on the top surface side, as compared with a horizontal semiconductor element, so as to reduce the chip size accordingly.

When the semiconductor module using the semiconductor element according to the first embodiment as a gate resistive element of the IGBT needs to increase the current capacity of the IGBT, the configuration of the IGBT is sometimes changed from a two-chip arrangement to a single-chip arrangement in order to increase the chip size of the IGBT. In such a case, when the structure is used in which two resistive layers having the same resistance value are provided in a single chip, as in the case of the vertical semiconductor element disclosed in JP 2019-106485 A and JP 2020-98822 A, a bonding wire is connected to only one of the electrodes on the top surface side of the two resistive layers. The resistance value of the semiconductor element to be packaged sometimes needs to be specifically set depending on the semiconductor module, which leads to an increase in the series number of the semiconductor element, and may impede the accurate choice of the appropriate resistance value. To deal with such a problem, the semiconductor element according to the first embodiment is provided, in the single chip, with the first resistive layer 3a and the second resistive layer 3b having the resistance values different from each other, so as to choose the appropriate resistance value.

<Bonding Device>

Figure 4:
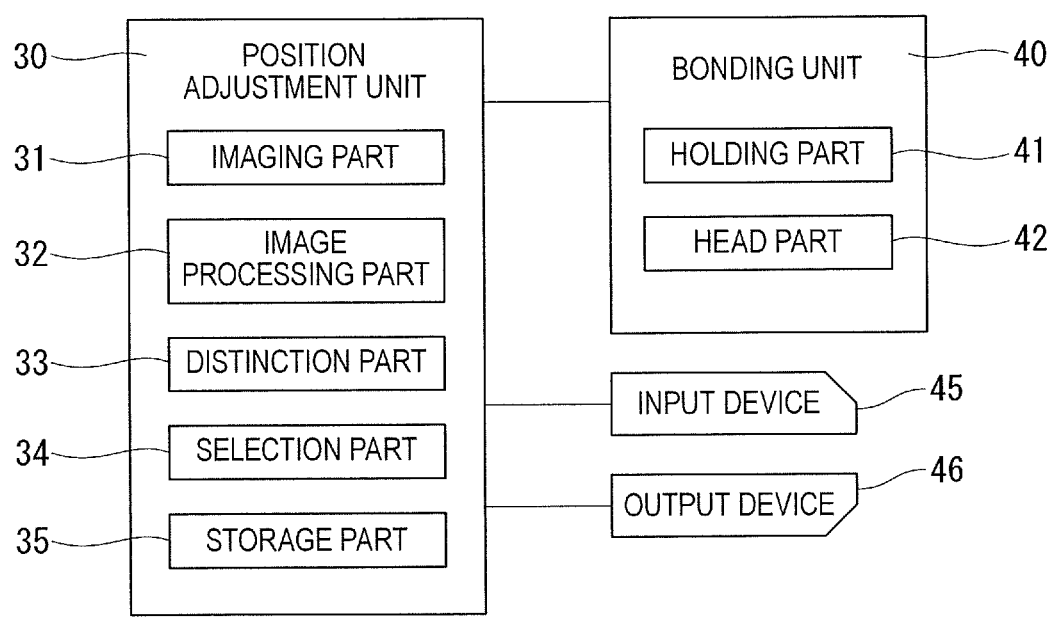
FIG. 4 is a schematic view illustrating a bonding device used in a process of assembling the semiconductor element according to the first embodiment of the present invention.

A bonding device used in the process of assembling the semiconductor element according to the first embodiment is described below. The bonding device includes a bonding unit 40, a position adjustment unit 30, an input device 45, and an output device 46, as illustrated in FIG. 4. The bonding unit 40 includes a holding part 41 and a head part 42. The holding part 41 holds the semiconductor element according to the first embodiment. For example, the semiconductor element according to the first embodiment is held by the holding part 41 in a state of being bonded onto an insulated circuit substrate via a bonding material such as solder. The head part 42 executes wire bonding for the semiconductor element according to the first embodiment held by the holding part 41.

The position adjustment unit 30 includes an imaging part 31, an image processing part 32, a distinction part 33, a selection part 34, and a storage part 35. The imaging part 31 captures a planar pattern of the semiconductor element according to the first embodiment as illustrated in FIG. 1, for example, so as to acquire an image. The image processing part 32 executes image processing for the image acquired by the imaging part 31.

The image processing part 32 automatically recognizes the corners P1 to P4 of the rectangular planar pattern of the first opening 7a and the corners P5 to P8 of the rectangular planar pattern of the second opening 7b according to a difference in contrast between the metal surfaces of the first external connection electrode 5a and the second external connection electrode 5b located at the end parts of the first opening 7a and the second opening 7b illustrated in FIG. 1 and the passivation film 7, so as to designate these corners as base points (feature points). The image processing part 32 uses the image acquired by the imaging part 31 to designate the positions of the corners P1 and P4 of the first opening 7a and the positions of the corners P6 and P7 of the second opening 7b as the base points, and registers the coordinates of the base points P1, P4, P6, and P7 to the storage part 35.

The distinction part 33 identifies the model of the semiconductor element according to the first embodiment in accordance with the image processing result obtained by the image processing part 32. The image processing part 32 detects (calculates), as target diagonal lengths, the diagonal length L11 that is a distance between the base points P1 and P4 and the diagonal length 12 that is a distance between the base points P6 and P7. The distinction part 33 calculates each difference between the respective detected target diagonal lengths and reference diagonal lengths preliminarily registered in the storage part 35. The distinction part 33 recognizes the semiconductor element according to the first embodiment as a normal product that conforms with the corresponding model when all of the calculated differences are smaller than a threshold (a predetermined value), and recognizes the semiconductor element according to the first embodiment as a defective product that does not conform with the corresponding model when at least any of the differences is greater than or equal to the threshold. This recognition can prevent a wrong choice of any semiconductor elements of different models if mixed with the semiconductor element according to the first embodiment.

If the semiconductor element according to the first embodiment leans when imaged by the imaging part 31 because of unevenness in thickness of the bonding material in the state in which the semiconductor element is bonded to the insulated circuit substrate and the like via the bonding material, an error is caused in the coordinates of the base points recognized by the image processing part 32, and an error in the target diagonal lengths calculated by the distinction part 33 is thus caused. The bonding device can recognize that the semiconductor element has a different planar pattern when the difference of the distances between the base points is 50 micrometers or greater, for example, although depending on the bonding device to be used. The threshold to be compared with the difference thus can be set to about 50 micrometers.

The distinction part 33 distinguishes between the first opening 7*a* and the second opening 7*b* in accordance with the diagonal lengths L11 and L12 calculated by the image processing part 32. The distinction part 33 can distinguish between the first opening 7*a* and the second opening 7*b* under the condition in which the difference between the respective diagonal lengths L11 and L12 is set to 50 micrometers or greater, for example. The distinction part 33 may distinguish between the first opening 7*a* and the second opening 7*b* in accordance with only one of the diagonal length L11 and the diagonal length L12.

The selection part 34 chooses the first resistive layer 3*a* or the second resistive layer 3*b* having an appropriate resistance value according to the performance of the semiconductor module in which the semiconductor element according to the first embodiment is packaged. The selection part 34 chooses, as a target for wire bonding, the pad region connected to the first resistive layer 3*a* or the second resistive layer 3*b* chosen from the pad regions implemented by the first external connection electrode 5*a* and the second external connection electrode 5*b* exposed to the first opening 7*a* and the second opening 7*b*. For example, when the resistance value of the first resistive layer 3*a* is appropriate, the selection part 34 chooses the pad region implemented by the first external connection electrode 5*a* connected to the first resistive layer 3*a*.

The storage part 35 stores the image acquired by the imaging part 31, the image processing result obtained by the image processing part 32, the distinction result obtained by the distinction part 33, the selection result obtained by the selection part 34, and the like. The input device 45 transmits an input operation input by an operator to the position adjustment unit 30. The output device 46 displays and shows, for the operator, the image or data, for example, output from the position adjustment unit 30.

<Method of Assembling Semiconductor Module>

Figure 5:
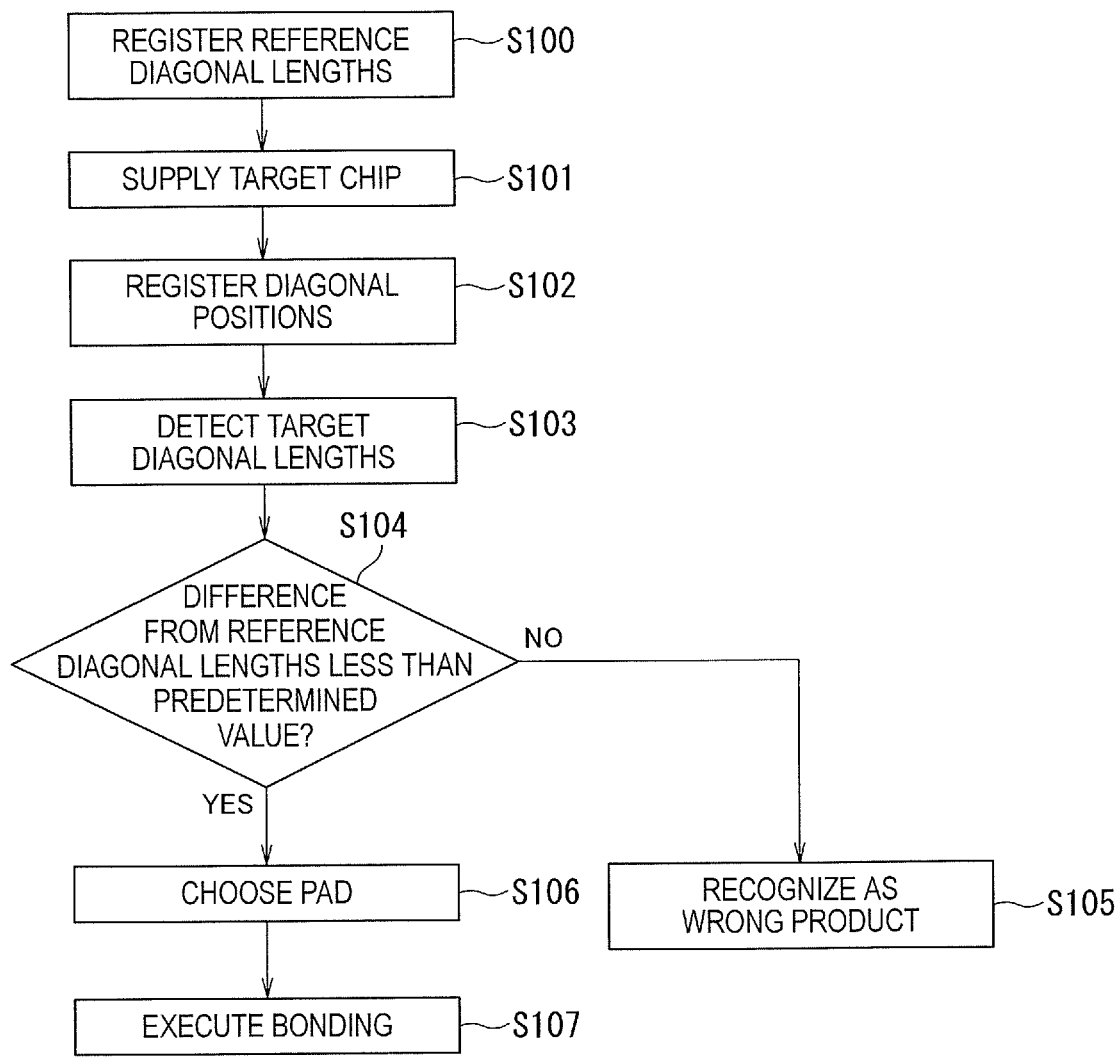
FIG. 5 is a flowchart showing an example of a method of assembling the semiconductor element according to the first embodiment of the present invention.

An example of a method of assembling the semiconductor element according to the first embodiment is described below with reference to the flowchart shown in FIG. 5. The semiconductor element according to the first embodiment is illustrated with a case of being used as a gate resistive element of an IGBT. A resistive chip used as the semiconductor element according to the first embodiment is bonded onto the insulated circuit substrate together with an IGBT chip via a bonding material such as solder.

In step S100, the reference diagonal lengths of the semiconductor element according to the first embodiment are registered. For example, a chip for reference (a reference chip) used as the semiconductor element according to the first embodiment is supplied to the bonding device as illustrated in FIG. 4 so as to be mounted on the holding part 41 of the bonding unit 40. The imaging part 31 of the position adjustment unit 30 captures the reference chip to acquire the image. The image processing part 32 designates the positions of the base points P1, P4, P6, and P7 as illustrated in FIG. 1 by use of the image acquired by the imaging part 31 to register the designated base points in the storage part 35. The image processing part 32 detects the diagonal length L11 between the base points P1 and P4 and the diagonal length L12 between the base points P6 and P7 to register the respective lengths as the reference diagonal lengths in the storage part 35. The reference diagonal lengths may be preliminarily registered in the storage part 35.

In step S101, a chip as a target for wire bonding (a target chip) used as the semiconductor element according to the first embodiment is supplied to the bonding device illustrated in FIG. 4. In step S102, the target chip is mounted on the holding part 41 of the bonding unit 40. The imaging part 31 of the position adjustment unit 30 captures the target chip to acquire the image. The image processing part 32 designates the positions of the base points P1, P4, P6, and P7 as illustrated in FIG. 1 by use of the image acquired by the imaging part 31 to register the designated base points in the storage part 35. In step S103, the image processing part 32 calculates the diagonal length L11 between the base points P1 and P4 and the diagonal length L12 between the base points P6 and P7 to register the respective lengths as the target diagonal lengths in the storage part 35.

In step S104, the distinction part 33 calculates each difference between the target diagonal lengths and the reference diagonal lengths. The distinction part 33 leads the process to proceed to step S105 when each difference between the target diagonal lengths and the reference diagonal lengths is a predetermined threshold (for example, 50 micrometers) or greater, and recognizes the target chip as a defective product wrongly chosen and mixed. The distinction part 33 leads the process to proceed to step S106 when the difference is smaller than the threshold, and recognizes the target chip as a normal product. The step S104 that identifies the model of the target chip to determine whether the target chip is a normal product may be omitted.

In step S106, the distinction part 33 distinguishes between the first opening 7*a* and the second opening 7*b* in accordance with the respective diagonal lengths L11 and L12 calculated by the image processing part 32. The selection part 34 chooses the pad region as a target for wire bonding in accordance with the first opening 7*a* and the second opening 7b distinguished by the distinction part 33 from the two pad regions implemented by the first external connection electrode 5a and the second external connection electrode 5b exposed to the first opening 7a and the second opening 7b. The head part 42 of the bonding unit 40 executes the wire bonding for the pad region chosen by the selection part 34.

COMPARATIVE EXAMPLE

Figure 6:
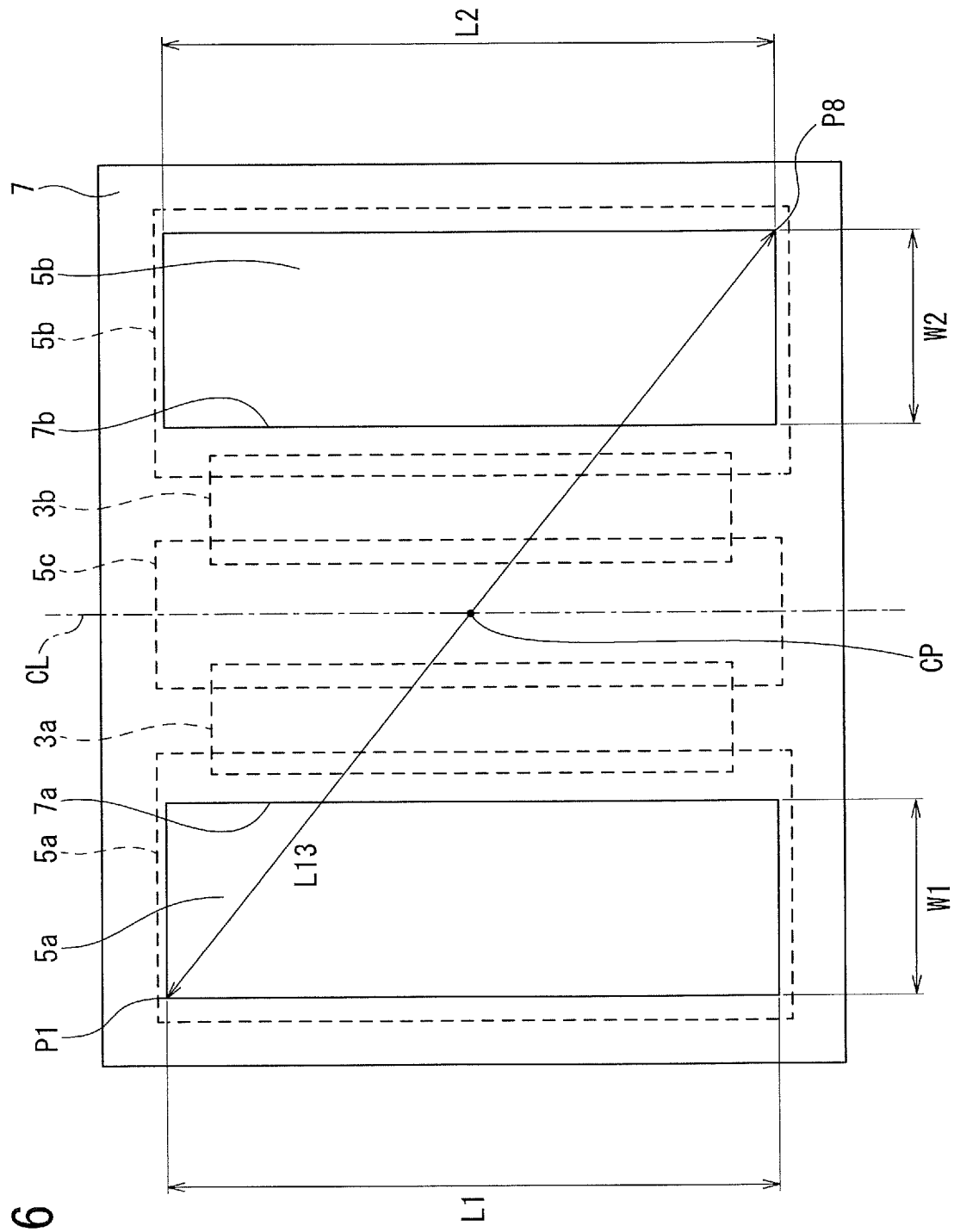
FIG. 6 is a plan view illustrating a semiconductor element of a comparative example.

A semiconductor element of a comparative example is described below. The semiconductor element of the comparative example differs from the semiconductor element according to the first embodiment illustrated in FIG. 1 in that the first resistive layer 3a and the second resistive layer 3b have the same size and the same resistance value, as illustrated in FIG. 6. The semiconductor element of the comparative example further differs from the semiconductor element according to the first embodiment illustrated in FIG. 1 in that the first opening 7a and the second opening 7b have the same shape and the same size. The semiconductor element of the comparative example has a planar pattern with line symmetry about the central line CL passing through the central point CP of the chip so as to have two-fold rotational symmetry about the central point CP of the chip.

The semiconductor element of comparative example uses the corner P1 on the upper left side of the first opening 7a and the corner P8 on the lower right side of the second opening 7b as the base points. The model of the semiconductor element of the comparative example is identified such that a diagonal length L13 between the base points P1 and P8 is detected. The structure of the semiconductor element of the comparative example allows a 180-degree rotation of the chip upon the assembly, and has the constant resistance value regardless of whether the wire bonding is executed for either the first external connection electrode 5a or the second external connection electrode 5b.

In contrast, the structure of the semiconductor element according to the first embodiment, which includes the first resistive layer 3a and the second resistive layer 3b having the resistance values different from each other, enables the choice of either the first resistive layer 3a or the second resistive layer 3b having the resistance value that matches the performance of the switching element of the IGBT or the like upon the assembly of the semiconductor module. The structure of the semiconductor element according to the first embodiment also facilitates the distinction of the first opening 7a or the second opening 7b since the first opening 7a and the second opening 7b have the shapes different from each other, so as to choose either the first resistive layer 3a or the second resistive layer 3b having the appropriate resistance value.

For example, the present embodiment, which switches the pad region used for the wire bonding between the two pad regions implemented by the first external connection electrode 5a and the second external connection electrode 5b, can deal with a case in which the appropriate chip resistance value varies when the chips provided on one insulated circuit substrate are common to each other, and the number of the insulated circuit substrates mounted on one semiconductor module needs to be changed so as to change the current specifications. The present embodiment thus can choose the appropriate resistance value without an increase in the series number of the semiconductor element.

Second Embodiment

Figure 7:
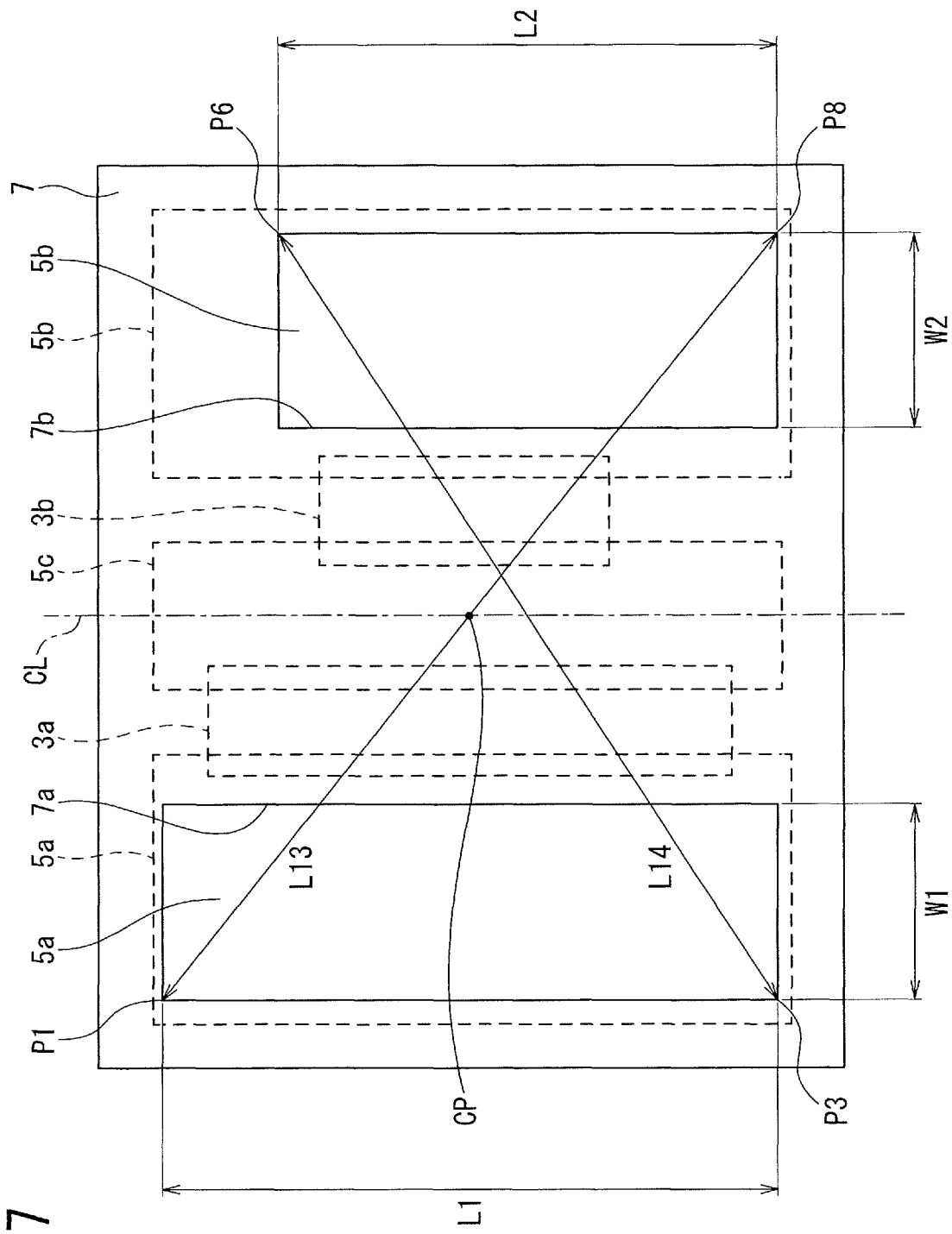
FIG. 7 is a plan view illustrating an example of a semiconductor element according to a second embodiment of the present invention.

A semiconductor element according to a second embodiment of the present invention illustrated in FIG. 7 has the same planar pattern as the semiconductor element according to the first embodiment illustrated in FIG. 1. The semiconductor element according to the second embodiment of the present invention differs from the semiconductor element according to the first embodiment in the positions of the corners used as the base points of the first opening 7a and the second opening 7b in the assembling process.

The second embodiment of the present invention uses the corner P1 on the upper left side of the first opening 7a and the corner P8 on the lower right side of the second opening 7b as the base points so as to detect a diagonal length L13 between the base points P1 and P8. The second embodiment of the present invention also uses the corner P3 on the lower left side of the first opening 7a and the corner P6 on the upper right side of the second opening 7b as the base points so as to detect a diagonal length L14 between the base points P3 and P6. The second embodiment of the present invention distinguishes between the first opening 7a and the second opening 7b in accordance with the respective diagonal lengths L13 and L14, so as to choose the pad region used for the wire bonding from the two pad regions implemented by the first external connection electrode 5a and the second external connection electrode 5b exposed to the first opening 7a and the second opening 7b. The other configurations of the second embodiment of the present invention are the same as those of the first embodiment, and overlapping explanations are not repeated below.

The second embodiment of the present invention, which detects the diagonal lengths L13 and L14 across the first opening 7a and the second opening 7b, can also distinguish between the first opening 7a and the second opening 7b, so as to choose either the first resistive layer 3a or the second resistive layer 3b having the appropriate resistance value.

Third Embodiment

Figure 8:
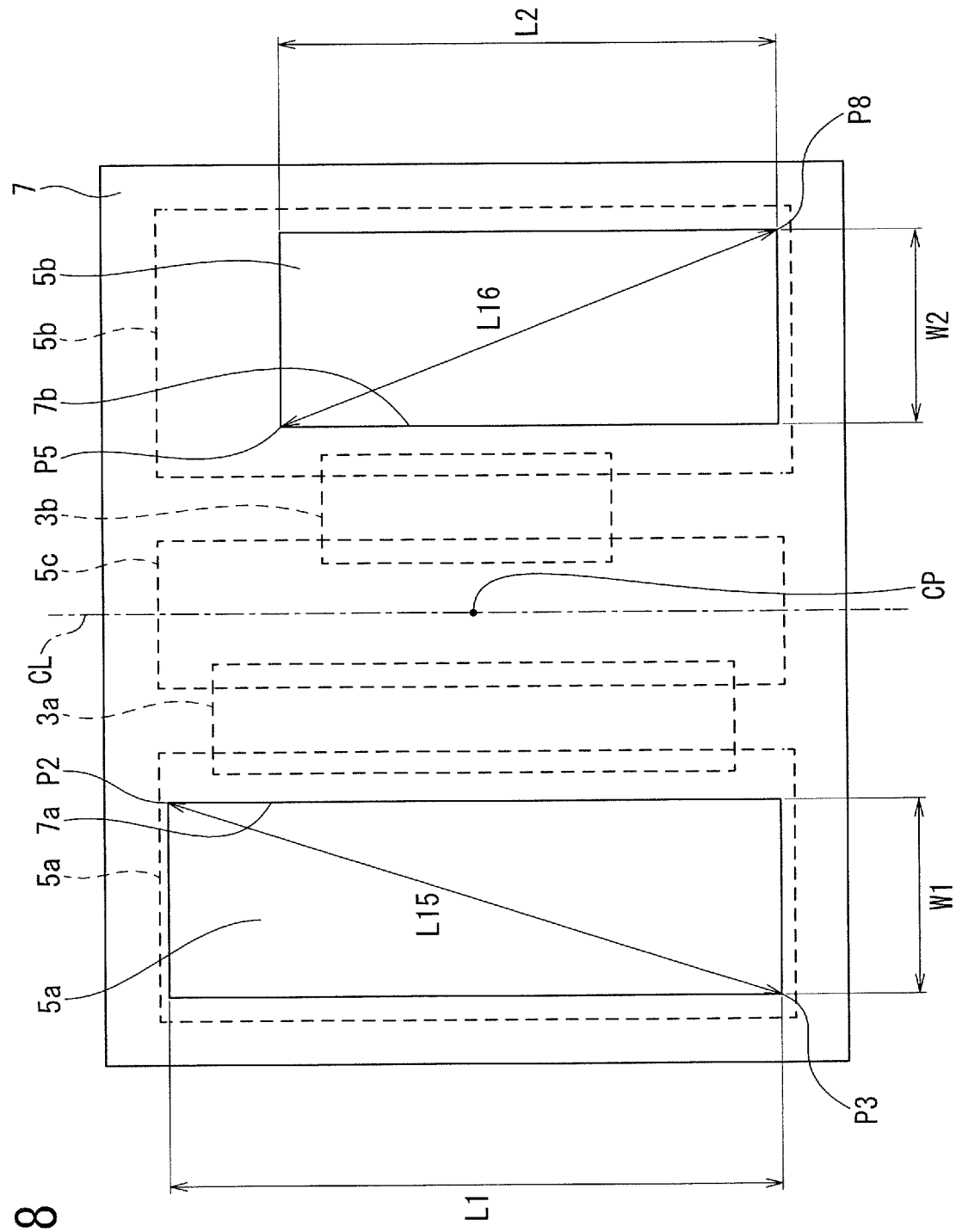
FIG. 8 is a plan view illustrating an example of a semiconductor element according to a third embodiment of the present invention.

A semiconductor element according to a third embodiment of the present invention illustrated in FIG. 8 has the same planar pattern as the semiconductor element according to the first embodiment illustrated in FIG. 1. The semiconductor element according to the third embodiment of the present invention differs from the semiconductor element according to the first embodiment in the positions of the corners used as the base points of the first opening 7a and the second opening 7b in the assembling process.

The third embodiment of the present invention uses the corner P2 on the upper right side and the corner P3 on the lower left side of the first opening 7a as the base points so as to detect a diagonal length L15 between the base points P2 and P3. The third embodiment of the present invention also uses the corner P5 on the upper left side and the corner P8 on the lower right side of the second opening 7b as the base points so as to detect a diagonal length L16 between the base points P5 and P8. The third embodiment of the present invention distinguishes between the first opening 7a and the second opening 7b in accordance with the respective diagonal lengths L15 and L16, so as to choose the pad region used for the wire bonding from the two pad regions implemented by the first external connection electrode 5a and the second external connection electrode 5b exposed to the first opening 7a and the second opening 7b. The other configurations of the third embodiment of the present invention are the same as those of the first embodiment, and overlapping explanations are not repeated below.

The third embodiment of the present invention, which detects the diagonal lengths L15 and L16 in the directions different from those in the first embodiment, can also distinguish between the first opening 7a and the second opening 7b, so as to choose either the first resistive layer 3a or the second resistive layer 3b having the appropriate resistance value.

Fourth Embodiment

Figure 9:
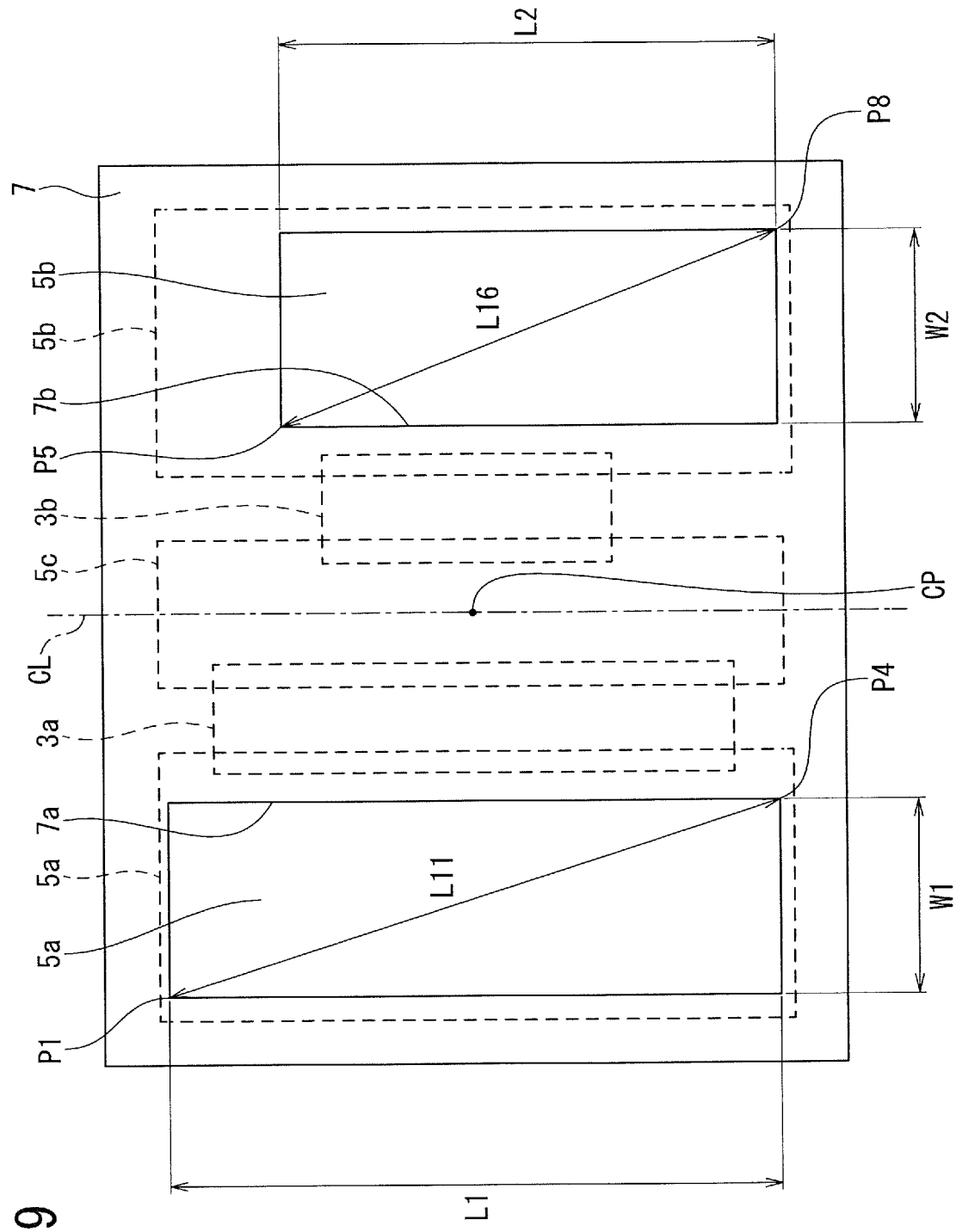
FIG. 9 is a plan view illustrating an example of a semiconductor element according to a fourth embodiment of the present invention.

A semiconductor element according to a fourth embodiment of the present invention illustrated in FIG. 9 has the same planar pattern as the semiconductor element according to the first embodiment illustrated in FIG. 1. The semiconductor element according to the fourth embodiment of the present invention differs from the semiconductor element according to the first embodiment in the positions of the corners used as the base points of the first opening 7a and the second opening 7b in the assembling process.

The fourth embodiment of the present invention uses the corner P1 on the upper left side and the corner P4 on the lower right side of the first opening 7a as the base points so as to detect the diagonal length L11 between the base points P1 and P4. The fourth embodiment of the present invention also uses the corner P5 on the upper left side and the corner P8 on the lower right side of the second opening 7b as the base points so as to detect the diagonal length L16 between the base points P5 and P8. The fourth embodiment of the present invention distinguishes between the first opening 7a and the second opening 7b in accordance with the respective diagonal lengths L11 and L16, so as to choose the pad region used for the wire bonding from the two pad regions implemented by the first external connection electrode 5a and the second external connection electrode 5b exposed to the first opening 7a and the second opening 7b. The other configurations of the fourth embodiment of the present invention are the same as those of the first embodiment, and overlapping explanations are not repeated below.

The fourth embodiment of the present invention, which detects the diagonal length L11 for the first opening 7a in the same direction as in the first embodiment and detects the diagonal length L16 for the second opening 7b in the direction different from that in the first embodiment, can also distinguish between the first opening 7a and the second opening 7b, so as to choose either the first resistive layer 3a or the second resistive layer 3b having the appropriate resistance value.

Fifth Embodiment

Figure 10:
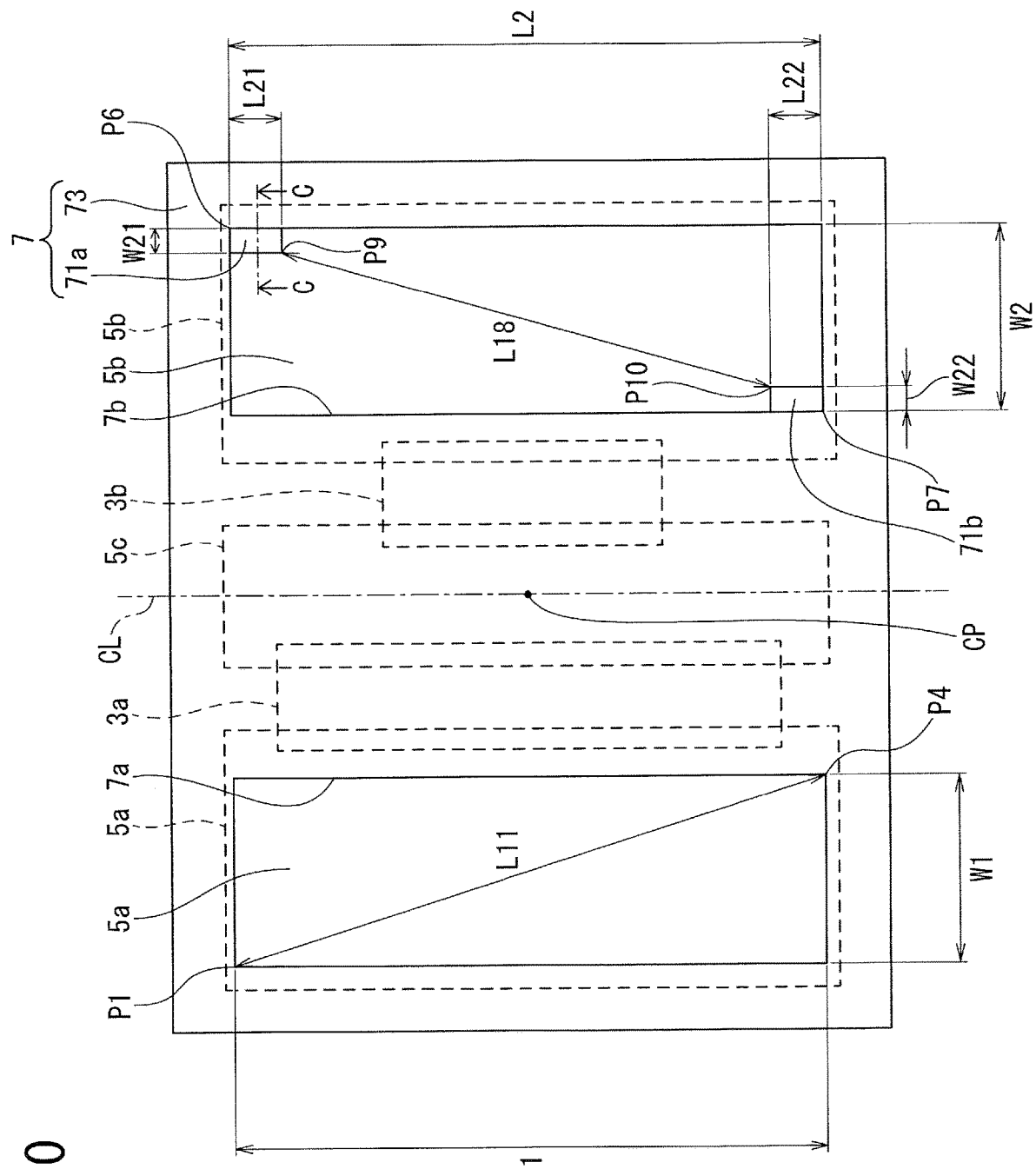
FIG. 10 is a plan view illustrating an example of a semiconductor element according to a fifth embodiment of the present invention.

A semiconductor element according to a fifth embodiment of the present invention differs from the semiconductor element according to the first embodiment illustrated in FIG. 1 in that the planar pattern of the second opening 7b is provided with projections (auxiliary patterns) 71a and 71b, as illustrated in FIG. 10. The projection 71a is provided at the corner P6 on the upper right side of the second opening 7b. The projection 71a has a rectangular planar pattern with a length L21 and a width W21. The projection 71b is provided at the corner P7 on the lower left side of the second opening 7b. The projection 71b has a rectangular planar pattern with a length L22 and a width W22.

The respective projections 71a and 71b may have the same shape or may have different shapes. The respective projections 71a and 71b are not limited to the rectangular planar pattern, and may have a triangular or stepped planar pattern. The projections 71a and 71b have the corners P9 and P10 that can be used as the base points, but the base points are not necessarily limited to these corners, and may be determined as appropriate depending on the shape of the respective projections 71a and 71b. While FIG. 10 illustrates the case in which the second opening 7b is provided with the projections 71a and 71b, the first opening 7a may be provided with the projections instead. The number of the projections provided in the first opening 7a or the second opening 7b can also be determined as appropriate.

Figure 11:
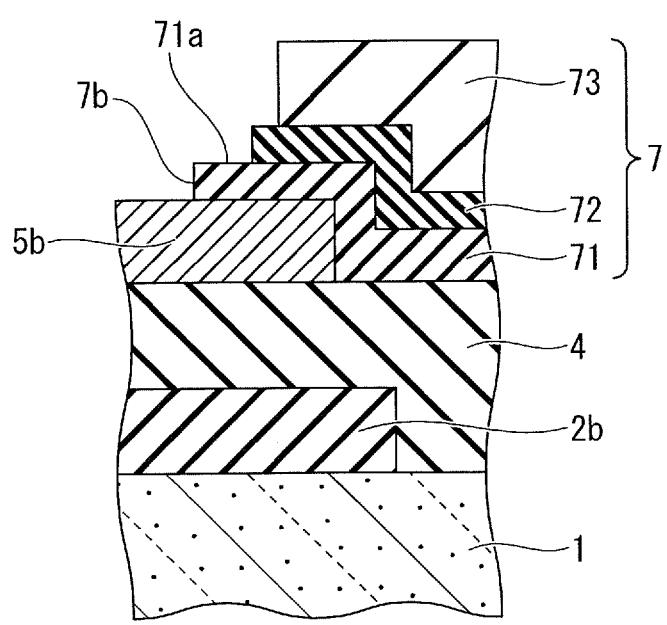
FIG. 11 is a cross-sectional view of the semiconductor element perpendicularly cross-sectioned along line C-C in FIG. 10.
Figure 12:
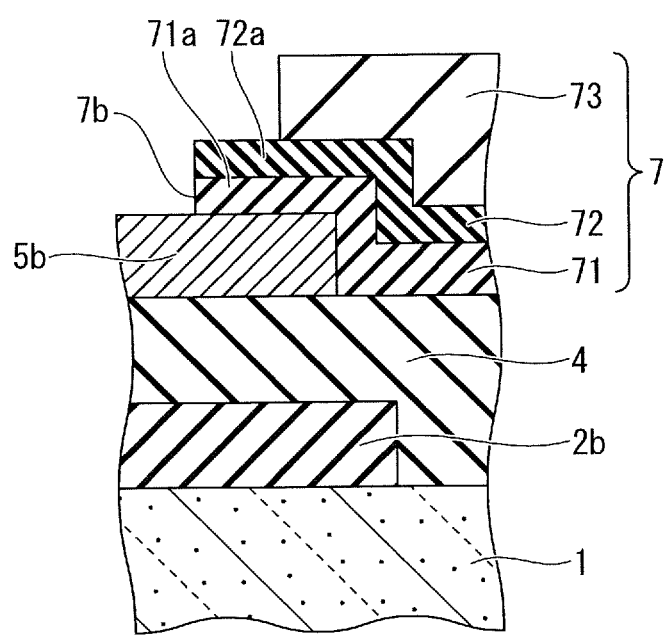
FIG. 12 is another cross-sectional view of the semiconductor element perpendicularly cross-sectioned along line C-C in FIG. 10.

The projection 71a is a part of the first passivation film 71 extending toward the second opening 7b, as illustrated in FIG. 11. The projection 71b illustrated in FIG. 10 is also a part of the first passivation film 71 extending toward the second opening 7b. The respective projections 71a and 71b can be formed such that an etching mask for selectively delineating a part of the first passivation film 71 is changed when the second opening 7b is formed. In addition, as illustrated in FIG. 12, a part of the second passivation film 72 may also extend toward the second opening 7b in the same matter as the first passivation film 71, so as to form the projections 71a and 72a that are the extending parts of the first passivation film 71 and the second passivation film 72.

The process of assembling the semiconductor element according to the fifth embodiment of the present invention uses the corner P1 on the upper left side and the corner P4 on the lower right side of the first opening 7a as the base points so as to detect the diagonal length L11 between the base points P1 and P4, as illustrated in FIG. 10. The assembling process also uses the corner P9 of the projection 71a on the upper right side and the corner P10 of the projection 71b on the lower left side of the second opening 7b as the base points so as to detect a diagonal length P18 between the base points P9 and P10. The assembling process distinguishes between the first opening 7a and the second opening 7b in accordance with the respective diagonal lengths L11 and L18, so as to choose the pad region used for the wire bonding from the two pad regions implemented by the first external connection electrode 5a and the second external connection electrode 5b exposed to the first opening 7a and the second opening 7b. The other configurations of the fifth embodiment of the present invention are the same as those of the first embodiment, and overlapping explanations are not repeated below.

While a reduction in size of the first opening 7a and the second opening 7b is presumed to be limited to some extent since the effective connection regions 10a and 10b need to be ensured sufficiently inside the first opening 7a and the second opening 7b, the fifth embodiment of the present invention, which provides the projections 71a and 71b in at least either the first opening 7a or the second opening 7b, can lead the first opening 7a and the second opening 7b to have different shapes with no necessity of the reduction in size of the first opening 7a and the second opening 7b. The fifth embodiment of the present invention thus can also distinguish between the first opening 7a and the second opening 7b, so as to choose either the first resistive layer 3a or the second resistive layer 3b having the appropriate resistance value.

Sixth Embodiment

Figure 13:
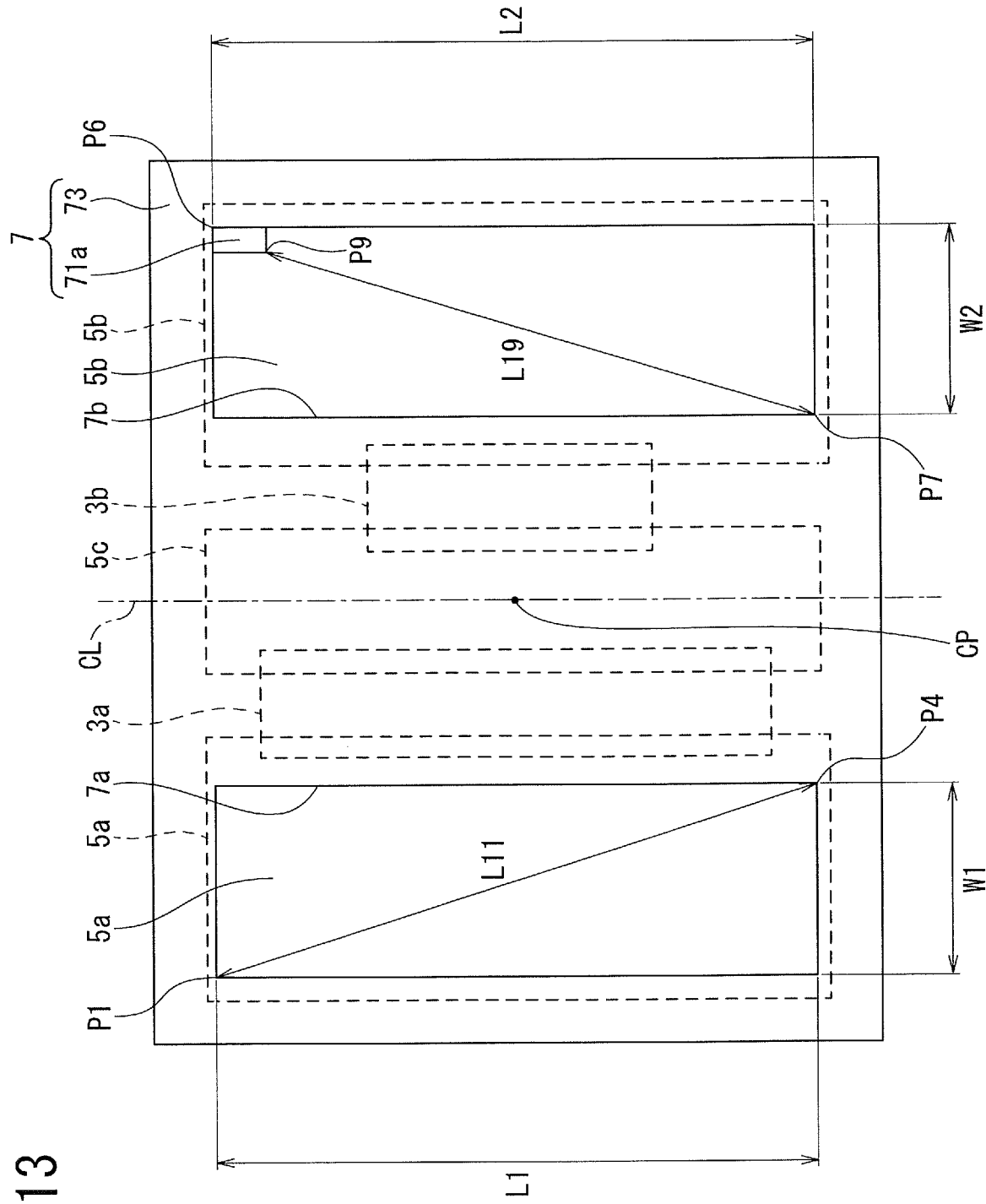
FIG. 13 is a plan view illustrating an example of a semiconductor element according to a sixth embodiment of the present invention.

A semiconductor element according to a sixth embodiment of the present invention illustrated in FIG. 13 is common to the semiconductor element according to the fifth embodiment illustrated in FIG. 10 in being provided with the projection 71a at the corner P6 on the upper right side of the second opening 7b. The semiconductor element according to the sixth embodiment of the present invention differs from the semiconductor element according to the fifth embodiment illustrated in FIG. 10 in that the projection is not provided at the corner P7 on the lower left side of the second opening 7b.

The process of assembling the semiconductor element according to the sixth embodiment of the present invention uses the corner P1 on the upper left side and the corner P4 on the lower right side of the first opening 7a as the base points so as to detect the diagonal length L11 between the base points P1 and P4, as illustrated in FIG. 13. The assembling process also uses the corner P9 of the projection 71a on the upper right side and the corner P7 on the lower left side of the second opening 7b as the base points so as to detect a diagonal length P19 between the base points P9 and P7. The assembling process distinguishes between the first opening 7a and the second opening 7b in accordance with the respective diagonal lengths L11 and L19, so as to choose the pad region used for the wire bonding from the two pad regions implemented by the first external connection electrode 5a and the second external connection electrode 5b exposed to the first opening 7a and the second opening 7b. The other configurations of the sixth embodiment of the present invention are the same as those of the fifth embodiment, and overlapping explanations are not repeated below.

The sixth embodiment of the present invention, which provides the second opening 7b with only one projection 71a, can lead the first opening 7a and the second opening 7b to have different shapes. The sixth embodiment of the present invention thus can also distinguish between the first opening 7a and the second opening 7b, so as to choose either the first resistive layer 3a or the second resistive layer 3b having the appropriate resistance value. The position and the number of the projections provided in the first opening 7a or the second opening 7b can be determined as appropriate.

Seventh Embodiment

Figure 14:
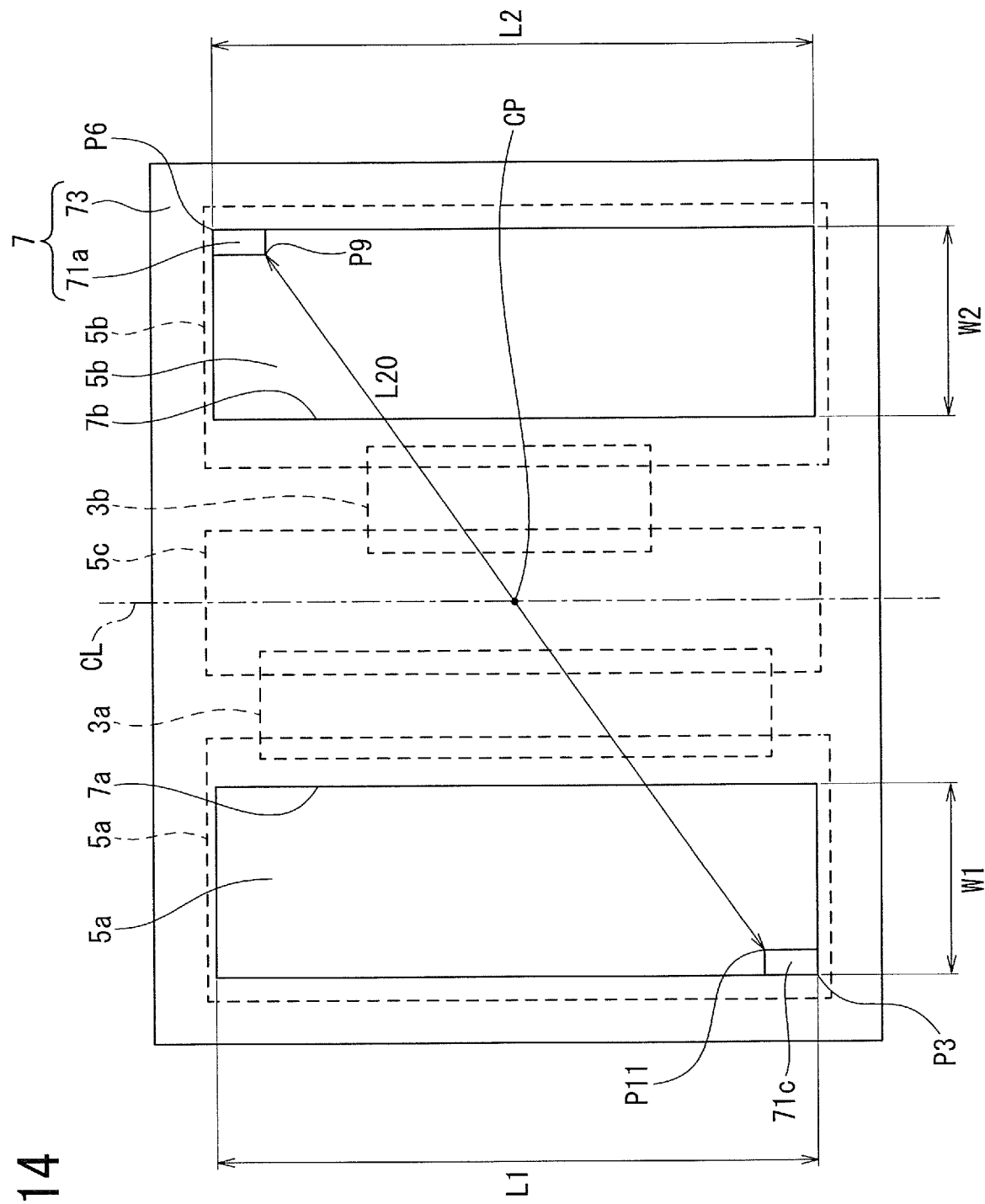
FIG. 14 is a plan view illustrating an example of a semiconductor element according to a seventh embodiment of the present invention.

A semiconductor element according to a seventh embodiment of the present invention illustrated in FIG. 14 is common to the semiconductor element according to the sixth embodiment illustrated in FIG. 13 in being provided with the projection 71a at the corner P6 on the upper right side of the second opening 7b. The semiconductor element according to the seventh embodiment of the present invention differs from the semiconductor element according to the sixth embodiment illustrated in FIG. 13 in that a projection 71c is further provided at the corner P3 on the lower left side of the first opening 7a.

The process of assembling the semiconductor element according to the seventh embodiment of the present invention uses the corner P9 of the projection 71a on the upper right side of the second opening 7b and a corner P11 of the projection 71c on the lower left side of the first opening 7a as the base points so as to detect a diagonal length L20 between the base points P9 and P11, as illustrated in FIG. 14 The assembling process distinguishes between the first opening 7a and the second opening 7b in accordance with the diagonal length L20, so as to choose the pad region used for the wire bonding from the two pad regions implemented by the first external connection electrode 5a and the second external connection electrode 5b exposed to the first opening 7a and the second opening 7b. The other configurations of the seventh embodiment of the present invention are the same as those of the sixth embodiment, and overlapping explanations are not repeated below.

The seventh embodiment of the present invention, which provides the first opening 7a and the second opening 7b with the corresponding projections 71a and 71c to use the corners P9 and P11 as the baes points so as to detect the diagonal length L20 between the base points P9 and P11 across the first opening 7a and the second opening 7b, can also distinguish between the first opening 7a and the second opening 7b, so as to choose either the first resistive layer 3a or the second resistive layer 3b having the appropriate resistance value.

OTHER EMBODIMENTS

As described above, the invention has been described according to the first to seventh embodiments, but it should not be understood that the description and drawings implementing a portion of this disclosure limit the invention. Various alternative embodiments of the present invention, examples, and operational techniques will be apparent to those skilled in the art from this disclosure.

The first to seventh embodiments have been illustrated with the case of detecting the diagonal lengths L11 to L20 of the first opening 7a and the second opening 7b, but are not limited to this case. When the length L1 of the first opening 7a and the length L2 of the second opening 7b are different from each other as described in the semiconductor element according to the first embodiment illustrated in FIG. 1, for example, either the corners P1 and P3 or the corners P2 and P4 of the first opening 7a may be used as the base points so as to detect the length L1 of the first opening 7a that is a distance between the base points. Similarly, either the corners P5 and P7 or the corners P6 and P8 of the second opening 7b may be used as the base points so as to detect the length L2 of the second opening 7b that is a distance between the base points. The first opening 7a and the second opening 7b then may be distinguished from each other in accordance with the length L1 of the first opening 7a and the length L2 of the second opening 7b.

Although not illustrated, when the width W1 of the first opening 7a and the width W2 of the second opening 7b are different from each other, either the corners P1 and P2 or the corners P3 and P4 of the first opening 7a may be used as the base points so as to detect the width W1 of the first opening 7a that is a distance between the base points. Similarly, either the corners P5 and P6 or the corners P7 and P8 of the second opening 7b may be used as the base points so as to detect the width W2 of the second opening 7b that is a distance between the base points. The first opening 7a and the second opening 7b then may be distinguished from each other in accordance with the width W1 of the first opening 7a and the width W2 of the second opening 7b.

While the first to seventh embodiments have been illustrated with the semiconductor element with the vertical structure connected to the semiconductor substrate 1 via the relay wire 5c as illustrated in FIG. 1 and FIG. 2, the semiconductor element may be a semiconductor element having a horizontal structure. In the case of the horizontal semiconductor element, a third external connection electrode and a fourth external connection electrode connected respectively to the first resistive layer 3a and the second resistive layer 3b may be provided on the top surface of the chip with the relay wire 5c omitted.

The respective semiconductor elements according to the first to seventh embodiments have been illustrated with the case of including the two resistive layers of the first resistive layer 3a and the second resistive layer 3b, the respective semiconductor elements may include three or more resistive layers having resistance values different from each other. The respective semiconductor elements then only need to include an external connection electrode for each resistive layer so as to be provided on the top surface side of the chip, while the openings to which the respective external connection electrodes are partly exposed have shapes and sizes different from each other.

The configurations disclosed in the first to seventh embodiments may be combined as appropriate within a range that does not contradict with the scope of the respective embodiments. As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present Specification.

What is claimed is:

1. A semiconductor element comprising:
   a first resistive layer;
   a second resistive layer separated from the first resistive layer, a resistance value of the second resistive layer being different from a resistive value of the first resistive layer;
   a first external connection electrode electrically connected to one end of the first resistive layer;
   a second external connection electrode separated from the first external connection electrode and electrically connected to one end of the second resistive layer; and
   a passivation film that covers the first external connection electrode and the second external connection electrode, the passivation film including:
      a first opening that partly exposes a top surface of the first external connection electrode, and has a first planar pattern, and
      a second opening that partly exposes a top surface of the second external connection electrode, and has a second planar pattern,
      wherein a shape of the first planar pattern is different from a shape of the second planar pattern.

2. The semiconductor element of claim 1, wherein
   the first planar pattern and the second planar pattern are not symmetrical about a central point of a region enclosing the first external connection electrode and the second external connection electrode, or
   the first planar pattern and the second planar pattern are not symmetrical about a central line between the first external connection electrode and the second external connection electrode.

3. The semiconductor element of claim 1, wherein
   the first planar pattern and the second planar pattern are each a rectangular shape, and
   a diagonal length of the first opening is different from a diagonal length of the second opening.

4. The semiconductor element of claim 3, wherein a difference between the diagonal length of the first opening and the diagonal length of the second opening is 50 micrometers or greater.

5. The semiconductor element of claim 1, wherein a corner of the first opening or the second opening includes a projection.

6. The semiconductor element of claim 1, further comprising:
   an insulating layer under the first resistive layer and the second resistive layer;
   a semiconductor substrate under the insulating layer;
   a relay wire electrically connected to another end of each of the first resistive layer and the second resistive layer, the relay wire in ohmic contact with the semiconductor substrate; and
   a counter electrode under the semiconductor substrate.

7. The semiconductor element of claim 6, wherein the relay wire, the first external connection electrode, and the second external connection electrode have planar patterns with line symmetry about a central line between the first external connection electrode and the second external connection electrode so as to have two-fold rotational symmetry about a central point of the semiconductor element.

8. The semiconductor element of claim 1, wherein the resistance value of the first resistive layer is less than the resistance value of the second resistive layer.

9. The semiconductor element of claim 1, wherein a first length, a first width, a first thickness, and/or a first material of the first resistive layer is different from a second length, a second width, a second thickness and/or a second material of the second resistive layer so that the resistance value of the first resistive layer is different than the resistance value of the second resistive layer.

10. The semiconductor element of claim 1, wherein the first planar pattern and the second planar pattern do not have two-fold rotational symmetry about a central point of a region enclosing the first external connection electrode and the second external connection electrode.

11. The semiconductor element of claim 1, wherein the first resistive layer and the second resistive layer are not symmetric about a central line between the first external connection electrode and the second external connection electrode.

12. The semiconductor element of claim 1, wherein the passivation film includes a three-layer structure.

13. The semiconductor element of claim 1, wherein
   the passivation film further includes:
      a first passivation film on the first external connection electrode and/or the second external connection electrode,
      a second passivation film on the first passivation film,
      a third passivation film on the second passivation film, and
      the third passivation film is retracted at an edge of the first opening and/or the second opening so that the first passivation film and the second passivation film protrude past the third passivation film at the first opening and/or the second opening.

* * * * *